United States Patent
Soneda

(10) Patent No.: US 10,186,571 B2
(45) Date of Patent: Jan. 22, 2019

(54) POWER SEMICONDUCTOR DEVICE AND METHOD THEREFOR

(71) Applicant: Mitsubishi Electric Corporation, Tokyo (JP)

(72) Inventor: Shinya Soneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/896,847

(22) Filed: Feb. 14, 2018

(65) Prior Publication Data

US 2018/0175142 A1 Jun. 21, 2018

Related U.S. Application Data

(63) Continuation of application No. 15/594,717, filed on May 15, 2017, now Pat. No. 9,972,675.

(30) Foreign Application Priority Data

Nov. 11, 2016 (JP) ................. 2016-220330

(51) Int. Cl.
*H01L 21/263* (2006.01)
*H01L 29/06* (2006.01)
(Continued)

(52) U.S. Cl.
CPC ........ *H01L 29/0626* (2013.01); *H01L 21/263* (2013.01); *H01L 27/0629* (2013.01);
(Continued)

(58) Field of Classification Search
CPC ..... H01L 21/00; H01L 21/263; H01L 21/265; H01L 21/22; H01L 21/324; H01L 21/304;
(Continued)

(56) References Cited

U.S. PATENT DOCUMENTS 7,705,398 B2  4/2010  Kaneda et al.
7,768,101 B2  8/2010  Suzuki et al.
(Continued)

FOREIGN PATENT DOCUMENTS

JP  2008-53648 A  3/2008
JP  2008-103590 A  5/2008
(Continued)

OTHER PUBLICATIONS

Hideki Takahashi, Aya Yamamoto, Shinji Aono and Tadaharu Minato, "1200V Reverse Conducting IGBT", Proceedings of 2004 International Symposium on Power Semiconductor Device & ICs, May 2004, p. 133-136.

*Primary Examiner* — Chuong A Luu
(74) *Attorney, Agent, or Firm* — Studebaker & Brackett PC

(57) ABSTRACT

An RC-IGBT according to the invention includes a high electric field cell formed in a region surrounded by an IGBT cell or in a region surrounded by a diode cell, and an n+ diffusion layer formed at a position opposed to the high electric field cell, the position being on a second main surface of an n− type drift layer. The high electric field cell has a higher maximum electric field intensity generated when a voltage is applied between main terminals than maximum electric field intensities of the IGBT cell, the diode cell, and a withstand voltage holding structure. Additionally, a p+ type collector layer and the high electric field cell fail to overlap with each other in a direction vertical to a first main surface of the n− type drift layer in a plane view.

1 Claim, 12 Drawing Sheets

(51) Int. Cl.
    *H01L 27/06*     (2006.01)
    *H01L 29/739*     (2006.01)
    *H01L 27/07*     (2006.01)

(52) U.S. Cl.
    CPC ...... *H01L 27/0647* (2013.01); *H01L 27/0727* (2013.01); *H01L 29/7396* (2013.01)

(58) Field of Classification Search
    CPC ............ H01L 21/26506; H01L 21/225; H01L 21/2253; H01L 21/2636; H01L 21/268; H01L 21/8249; H01L 21/266; H01L 21/221; H01L 21/04; H01L 21/0445
    USPC ....................................................... 257/140
    See application file for complete search history.

(56) References Cited

U.S. PATENT DOCUMENTS

| | | |
|---|---|---|
| 7,847,345 B2 | 12/2010 | Takahashi |
| 8,013,360 B2 | 9/2011 | Saito et al. |
| 2012/0220091 A1 | 8/2012 | Challa et al. |
| 2016/0087064 A1* | 3/2016 | Ohashi ................. H01L 21/049 257/77 |
| 2016/0172452 A1* | 6/2016 | Darwish ............... H01L 29/408 257/339 |
| 2016/0218101 A1 | 7/2016 | Gejo |
| 2017/0047322 A1 | 2/2017 | Yoshida et al. |

FOREIGN PATENT DOCUMENTS

| | | |
|---|---|---|
| JP | 2008-109028 A | 5/2008 |
| JP | 2009-170670 A | 7/2009 |
| JP | 2016-139719 A | 8/2016 |
| WO | 2016080269 A1 | 5/2016 |

\* cited by examiner

F I G . 1
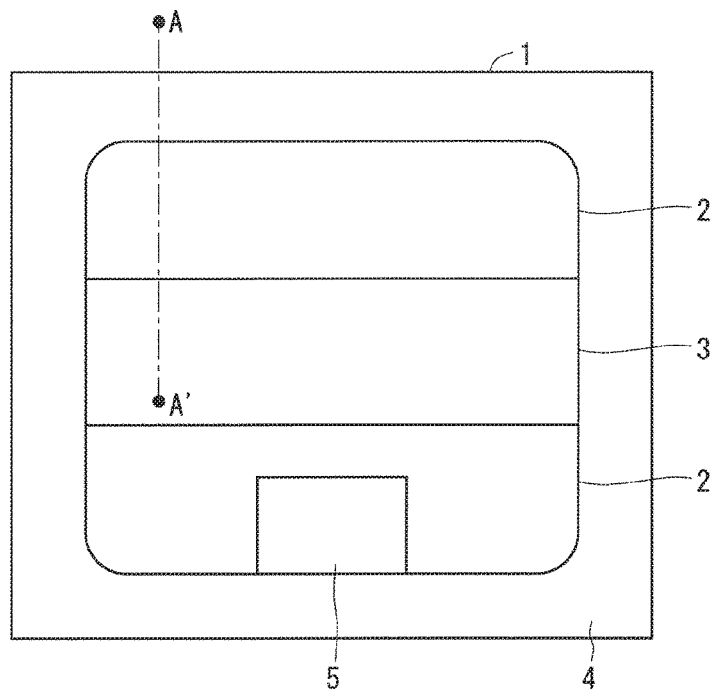
F I G . 2
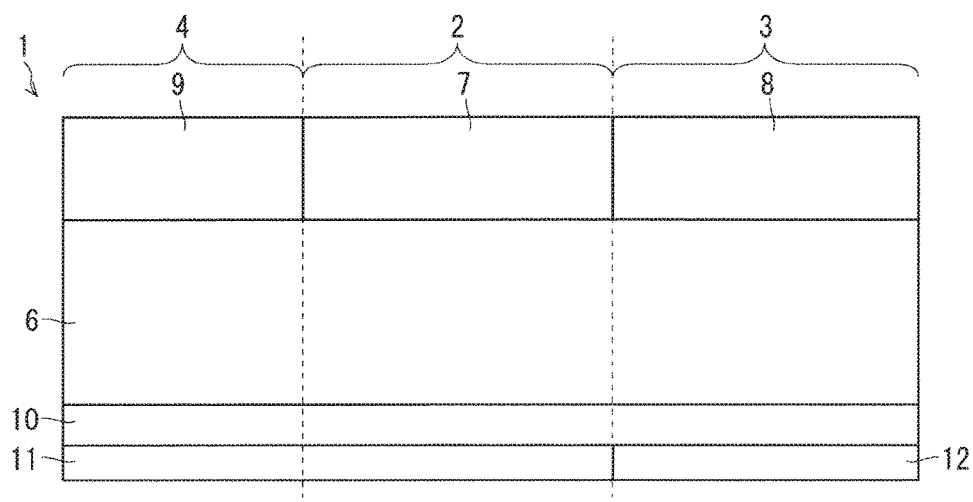

F I G. 5
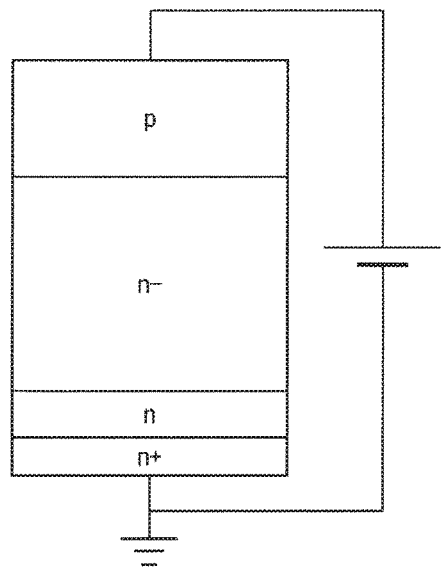
F I G. 6
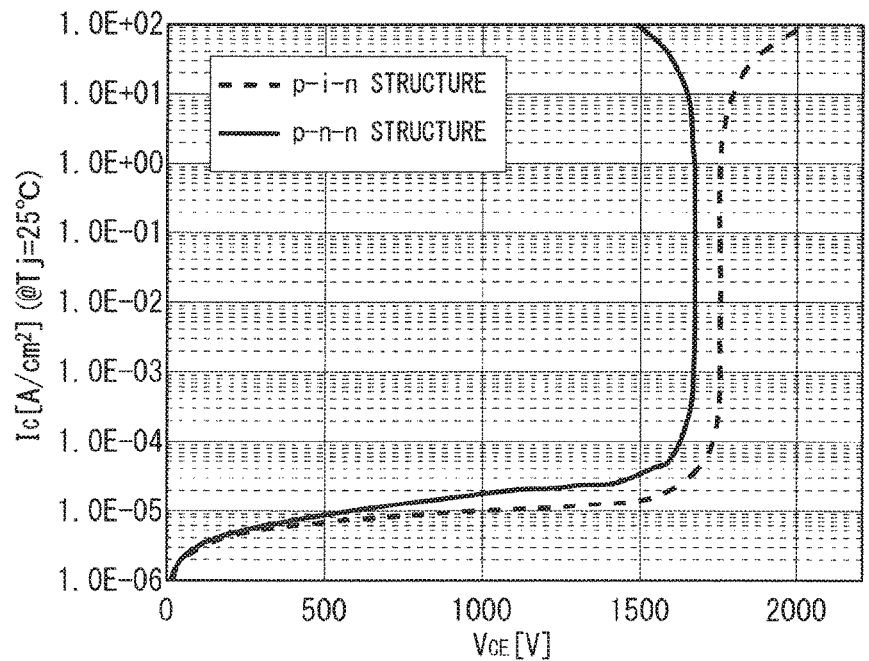

F I G . 1 1
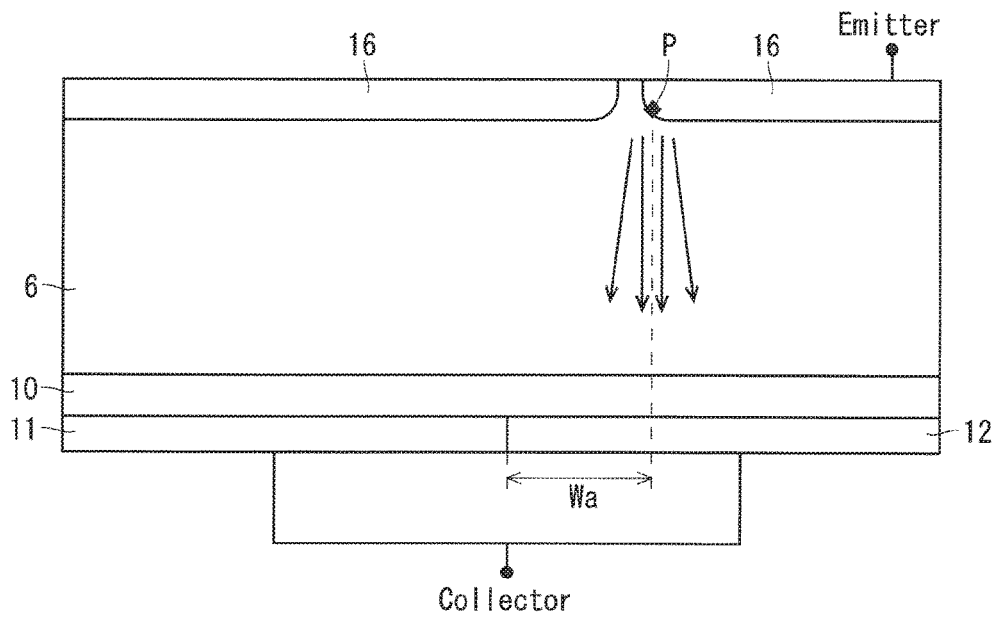
F I G . 1 2
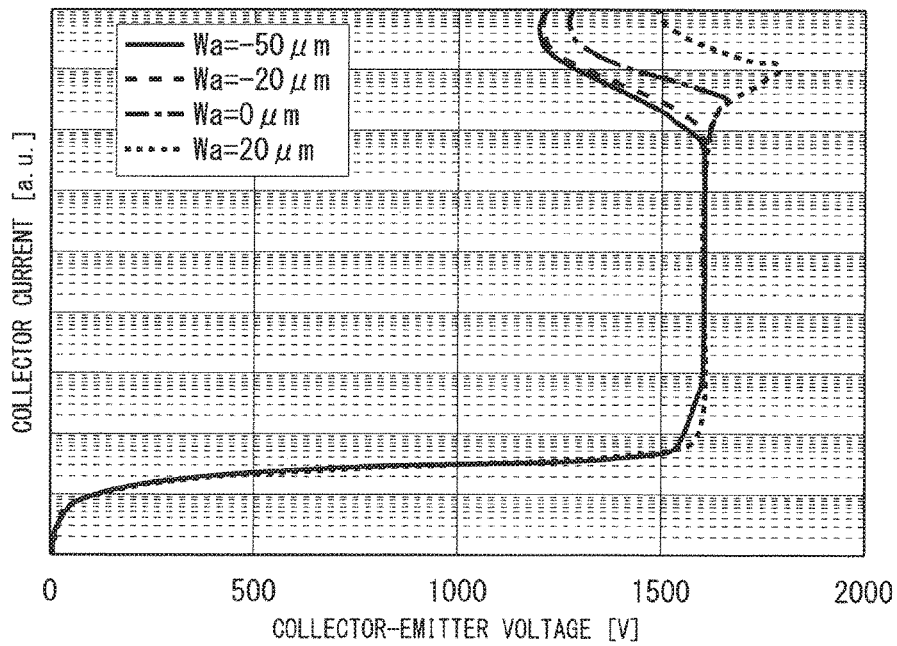

F I G . 1 5
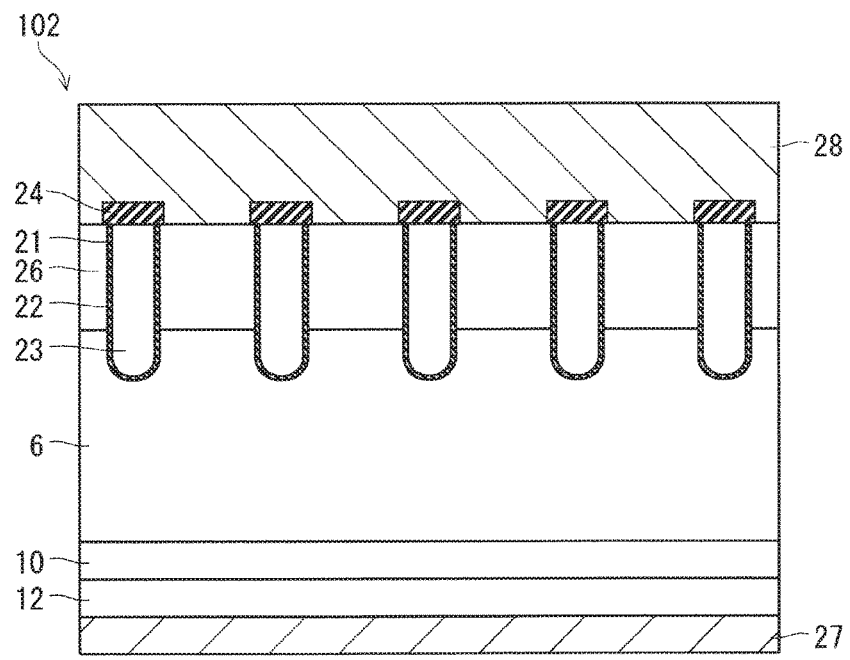
F I G . 1 6
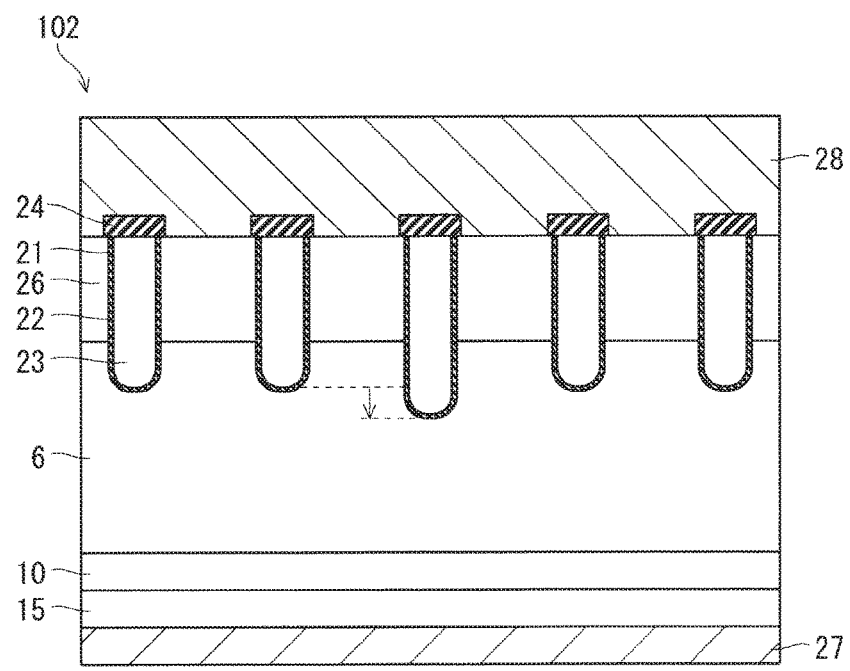

F I G . 2 1
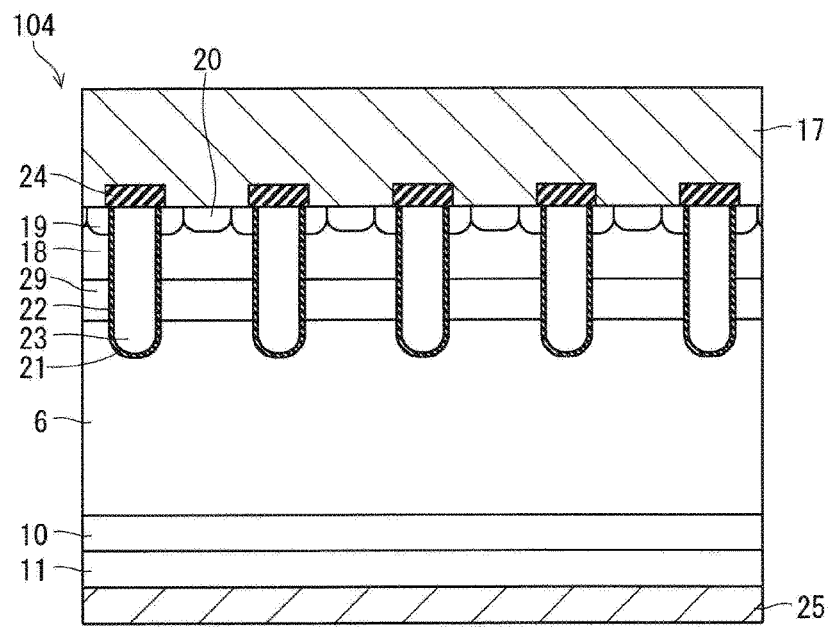
F I G . 2 2
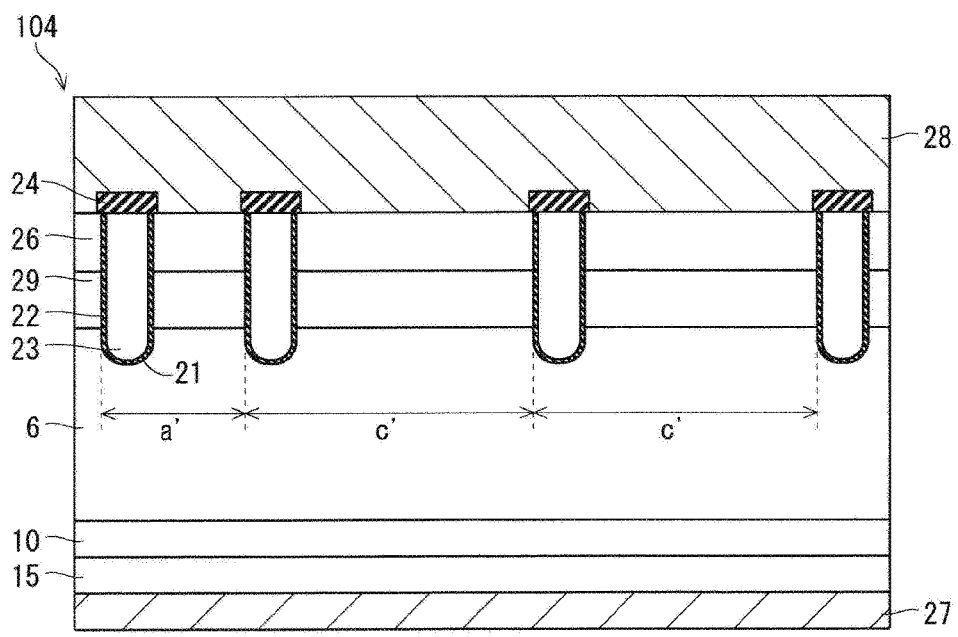

POWER SEMICONDUCTOR DEVICE AND METHOD THEREFOR

CROSS REFERENCE TO RELATED APPLICATIONS

This application is a Continuation of U.S. patent application Ser. No. 15/594,717 filed May 15, 2017, now U.S. Pat. No. 9,972,675 which claims priority to and the benefit of Japanese Patent Application No. 2016-220330 filed Nov. 11, 2016, the entire contents of which are incorporated herein by reference.

BACKGROUND OF THE INVENTION

Field of the Invention

The present invention relates to a power semiconductor device and a method therefor.

Description of the Background Art

Power devices as power semiconductor devices are used in a wide range from a field of home appliances, electric vehicles or railways to a field of solar photovoltaic power generation or wind power generation which field draws much attention as renewable energy. In these fields, an inverter circuit is configured with power devices to drive an inductive load such as an induction motor in many cases. In such a case, a free wheeling diode (hereinafter, referred to as FWD) is required for feedback of currents generated by a counter electromotive force of an inductive load, and a common inverter circuit is configured with a plurality of insulated gate bipolar transistors (hereinafter, referred to as IGBT) and FWDs.

However, reduction in size and weight and low costs are strongly demanded of inverter circuits, and thus there occurs a problem that it is not desirable to mount a plurality of semiconductor elements on an inverter circuit. As one solution to this problem, development is under way of reverse conducting IGBT (hereinafter, referred to as RC-IGBT) which is integration of an IGBT and a FWD, and applying an RC-IGBT to an inverter circuit is expected to reduce an area of semiconductor elements mounted on the inverter circuit and reduce costs.

An RC-IGBT is recited in each of "ISPSD 2004", May 2004, P 133 to 136, and Japanese Patent Application Laid-Open No. 2008-53648, Japanese Patent Application Laid-Open No. 2008-103590, and Japanese Patent Application Laid-Open No. 2008-109028. On a surface of a common IGBT on which only a p type collector layer is formed, a p type collector layer and an n type cathode layer are formed in an RC-IGBT.

In an RC-IGBT of a conventional structure, since a p type diffusion layer is formed on a back surface side of an n type drift layer in a withstand voltage holding region, avalanche currents are liable to be generated in the withstand voltage holding region to cause avalanche breakdown. However, in such application to automobiles as, in particular, demanded to have high reliability, avalanche breakdown is not allowed. For increasing a resistance to avalanche breakdown, it is effective to reduce a concentration of a p type diffusion layer on a back surface of an n type drift layer, to reduce a resistivity of an n type drift layer corresponding to n of a p-n-p structure, or to increase a thickness of an n type drift layer.

However, since the p type diffusion layer on the back surface of the n type drift layer is used for controlling performance of an IGBT, a concentration thereof cannot be reduced. Additionally, a resistivity of the n type drift layer cannot be reduced either because of inviting a reduction in a withstand voltage. Therefore, an increase in a thickness of the n type drift layer cannot be avoided in order to ensure a resistance to avalanche breakdown.

However, the larger a thickness of the n type drift layer becomes, the more performances of both an IGBT region and an FWD region deteriorate to increase an energy loss produced in an RC-IGBT.

SUMMARY OF THE INVENTION

The present invention aims at improving element performance by thinning a drift layer in a power semiconductor device, as well as ensuring a resistance to avalanche breakdown.

A power semiconductor device of the present invention includes a first conductive type drift layer; an IGBT cell; a diode cell; a withstand voltage holding structure; a high electric field cell; a second conductive type collector layer; a first conductive type cathode layer; and a first conductive type diffusion layer. The IGBT cell, the diode cell and the withstand voltage holding structure are formed on a first main surface of the drift layer. The high electric field cell is formed in a region surrounded by the IGBT cell or in a region surrounded by the diode cell on the first main surface of the drift layer. The collector layer is formed at a position opposed to the IGBT cell and the withstand voltage holding structure, the position being on a second main surface opposite to the first main surface of the drift layer. The cathode layer is formed at a position opposed to the diode cell on the second main surface of the drift layer. The diffusion layer is formed at a position opposed to the high electric field cell on the second main surface of the drift layer. The high electric field cell has a higher maximum electric field intensity generated when a voltage is applied between main terminals than maximum electric field intensities of the IGBT cell, the diode cell, and the withstand voltage holding structure. The collector layer and the high electric field cell fail to overlap with each other in a direction vertical to the first main surface of the drift layer in a plane view.

In the power semiconductor device of the present invention, the high electric field cell fails to overlap the collector layer in the direction vertical to the first main surface of the drift layer in a plane view, and has a higher maximum electric field intensity generated when a voltage is applied between the main terminals than the maximum electric field intensities of the IGBT cell, the diode cell and the withstand voltage holding structure. Accordingly, element performance can be improved by thinning the drift layer while ensuring a resistance to avalanche breakdown.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a top view of a chip of an RC-IGBT according to the assumption art;

FIG. 2 is a schematic sectional view taken along A-A' of FIG. 1;

FIG. 5 is a schematic sectional view of a p-n-p structure;

FIG. 6 is a diagram showing current-voltage characteristics of sectional structures shown in FIG. 4 and FIG. 5;

FIG. 11 is a schematic sectional view of a simulation model;

FIG. 12 is a diagram showing current-voltage characteristic of the simulation model of FIG. 11;

FIG. 15 is a schematic sectional view of a diode region of the RC-IGBT according to the second preferred embodiment of the present invention;

FIG. 16 is a schematic sectional view of a high electric field cell region of the RC-IGBT according to the second preferred embodiment of the present invention;

FIG. 21 is a schematic sectional view of an IGBT region of an RC-IGBT according to a fourth preferred embodiment of the present invention;

FIG. 22 is a schematic sectional view of a high electric field cell region of the RC-IGBT according to the fourth preferred embodiment of the present invention;

DESCRIPTION OF THE PREFERRED EMBODIMENTS

A. Assumption Art

Figure 3:
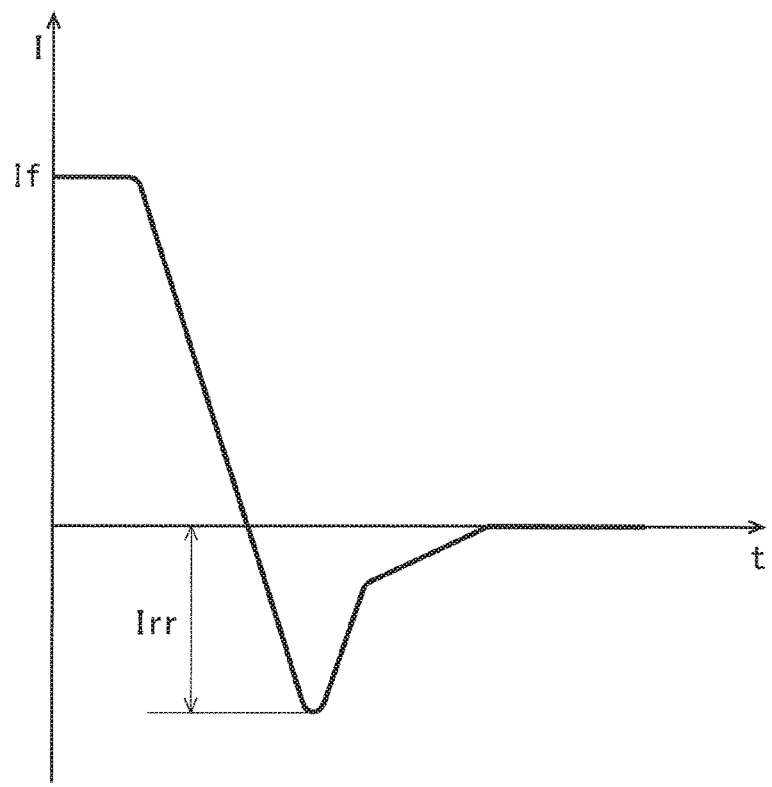
FIG. 3 is a diagram showing a current waveform at the time of reverse recovery when an FWD is changed from on to off.

In the present specification, although a first conductive type will be described as an n type, and a second conductive type as a p type, these conductive types may be reverse to each other.

FIG. 1 is a top view of a chip of an RC-IGBT 1 made of Si according to the assumption art of the present invention, and FIG. 2 is a schematic sectional view taken along A-A' of FIG. 1. As shown in FIG. 1, the RC-IGBT 1 is configured with an IGBT region 2, a diode region 3, a withstand voltage holding region 4, and a gate pad 5. For the sake of convenience, illustration of a gate wiring region is omitted in FIG. 1.

As shown in FIG. 2, in the RC-IGBT 1, compositions are formed in both surfaces of an n− type drift layer 6. On a first main surface of the n− type drift layer 6 as a surface on an upper side of a sheet of FIG. 2, an IGBT cell 7 is arranged in the IGBT region 2, a diode cell 8 in the diode region 3, and a withstand voltage holding structure 9 in the withstand voltage holding region 4, respectively. The IGBT cell 7 has an emitter structure functioning as a MOSFET, the diode cell 8 has a structure functioning as an anode of a diode, and the withstand voltage holding structure 9 has a field limiting ring (FLR) structure formed with p type diffusion layers or a reduced surface field (RESURF) structure. In FIG. 2, with no details of these structures shown, only arrangement regions thereof are shown.

On a second main surface as a main surface on a side opposite to the first main surface of the n− type drift layer 6, a p+ type collector layer 11 is arranged in the IGBT region 2 and the withstand voltage holding region 4, and an n+ type cathode layer 12 is arranged in the diode region 3, respectively, via an n type buffer layer 10.

Specifically, the withstand voltage holding structure 9, and the n− type drift layer 6, the n type buffer layer 10 and the p+ type collector layer 11 which are immediately thereunder configure the withstand voltage holding region 4; the IGBT cell 7, and the n− type drift layer 6, the n type buffer layer 10 and the p+ type collector layer 11 which are immediately thereunder configure the IGBT region 2; and the diode cell 8, and the n− type drift layer 6, the n type buffer layer 10 and the n+ type cathode layer 12 which are immediately thereunder configure the diode region 3.

Although in FIG. 2, a boundary between the p+ type collector layer 11 and the n+ type cathode layer 12 is illustrated to be the same as a boundary between the IGBT region 2 and the diode region 3, these boundaries are not coincide with each other in some cases as proposed in Japanese Patent Application Laid-Open No. 2016-111077.

Here, brief description will be made of recovery characteristics of a diode. FIG. 3 shows a current waveform at the time of reverse recovery when an FWD is changed from on to off. When the FWD is turned off from on, reverse direction currents flow from a cathode layer toward an anode layer. A peak value of the reverse direction currents is referred to as a recovery current (Irr). The recovery current is required to be small because of generation of an energy loss. In general, a recovery current can be reduced by reducing an impurity concentration of the anode layer.

At the time of recovery operation of the RC-IGBT 1, when the p type diffusion layer configuring the withstand voltage holding structure 9 operates as an anode layer, a recovery current is increased. Therefore, it is necessary to suppress diode operation of the withstand voltage holding region 4 by forming a p type diffusion layer, i.e. the p+ type collector layer 11, on the second main surface side of the n− type drift layer 6 in the withstand voltage holding region 4.

The IGBT region 2 and the diode region 3 are easily designed to have a lower electric field intensity generated in Si (hereinafter, recitation of "electric field intensity" represents an electric field intensity generated in Si when a voltage is applied between a collector and an emitter) than that of the withstand voltage holding region 4. Accordingly, when a voltage is applied between main terminals of the RC-IGBT 1, i.e. between a collector and an emitter, an electric field intensity generated in the withstand voltage holding region 4 becomes higher than those in the IGBT region 2 and the diode region 3. When the collector-emitter voltage is increased, the electric field intensity exceeds a critical electric field intensity of Si in the withstand voltage holding region 4, so that an avalanche current is generated due to impact ionization. A voltage at which the avalanche current is generated will be a characteristic value called a withstand voltage ($BV_{CES}$) of an element.

Figure 4:
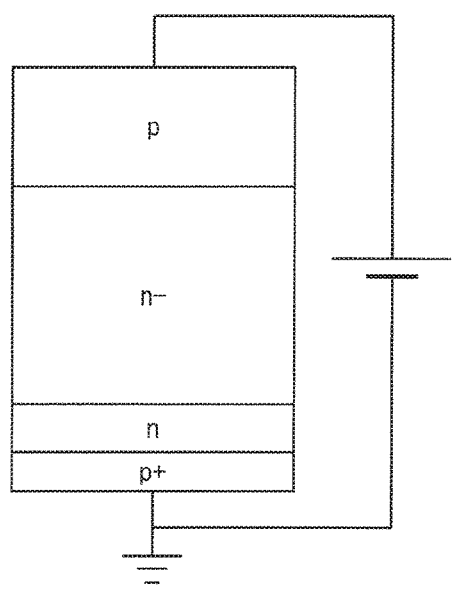
FIG. 4 is a schematic sectional view of a p-i-n structure.

Here, description will be made of withstand voltage waveforms in a p-i-n structure and a p-n-p structure. FIG. 4 is a schematic sectional view of the p-i-n structure, FIG. 5 is a schematic sectional view of the p-n-p structure, and FIG. 6 shows simulation results of withstand voltage waveforms in the p-i-n structure and the p-n-p structure shown in FIGS. 4 and 5.

As shown in FIG. 6, in the p-i-n structure, when an applied voltage exceeds a withstand voltage, an avalanche current is generated, and in a high current density region, the withstand voltage is further increased. By contrast, in the p-n-p structure, there is a negative resistance region with a reduced withstand voltage in a high current density region because when an avalanche current is generated, holes are injected from a p+ type region to make it impossible to maintain an electric field. This phenomenon has been reported also in ISPSD 1997, p 89 to p 92. In the negative resistance region, positive feedback of a withstand voltage reduction and a current increase is caused to invite a failure leading to breakdown (hereinafter, recited as "avalanche breakdown") in some cases. Therefore, the p-i-n structure is more resistant to avalanche breakdown than the p-n-p structure.

Specifically, the RC-IGBT 1 has a problem that avalanche breakdown is more liable to occur because an avalanche current is generated in the withstand voltage holding region 4 where on the second main surface side of the n– type drift layer 6, the p+ type collector layer 11 is formed. For increasing a resistance to avalanche breakdown, it is effective to reduce a concentration of the p+ type collector layer 11, to reduce a resistivity of the n– type drift layer 6, or to increase a thickness of the n– type drift layer 6. However, since the p+ type collector layer 11 is used for controlling performance of the IGBT, concentration thereof cannot be reduced because of ensuring a resistance to avalanche breakdown. Additionally, a reduction in a resistivity of the n– type drift layer 6 invites a reduction in a withstand voltage. Therefore, for ensuring a resistance against avalanche breakdown, an increase in a thickness of the n– type drift layer 6 cannot be avoided. However, the larger the thickness of the n– type drift layer 6 becomes, the more performances of both the IGBT region 2 and the diode region 3 deteriorate to increase an energy loss produced in an RC-IGBT.

Under these circumstances, the present invention adopts the following idea. In the following, preferred embodiments and manufacturing methods of the present invention will be described with reference to the drawings. The top views and the schematic sectional views of a chip disclosed in the preferred embodiments are one example only and are not limited thereto.

B. First Preferred Embodiment

B-1. Configuration

Figure 7:
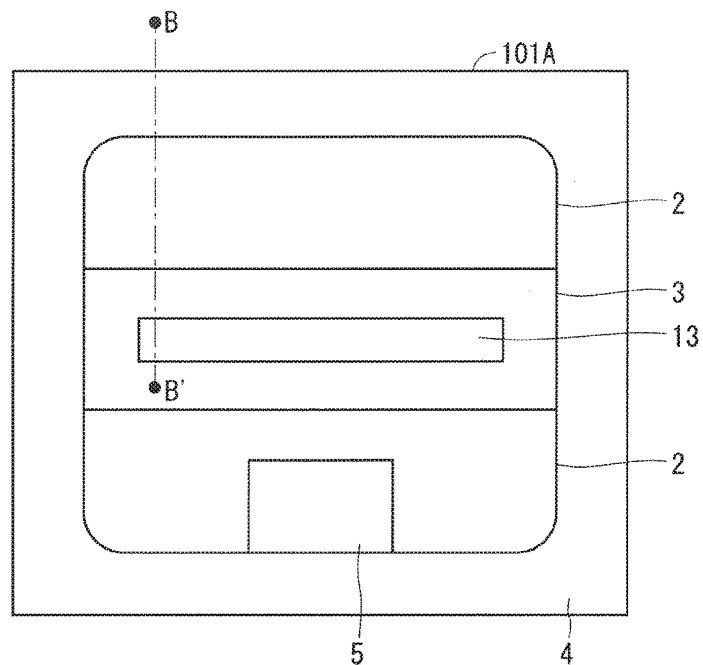
FIG. 7 is a top view of a chip of an RC-IGBT according to a first preferred embodiment of the present invention.

FIG. 7 is a top view of a chip of an RC-IGBT 101A according to a first preferred embodiment of the present invention. The RC-IGBT 101A is the same as the RC-IGBT 1 according to the assumption art in being configured with an IGBT region 2, a diode region 3, a withstand voltage holding region 4 and a gate pad 5 and is different from the RC-IGBT 1 in that a high electric field cell region 13 is arranged in a region surrounded by the diode region 3.

Figure 8:
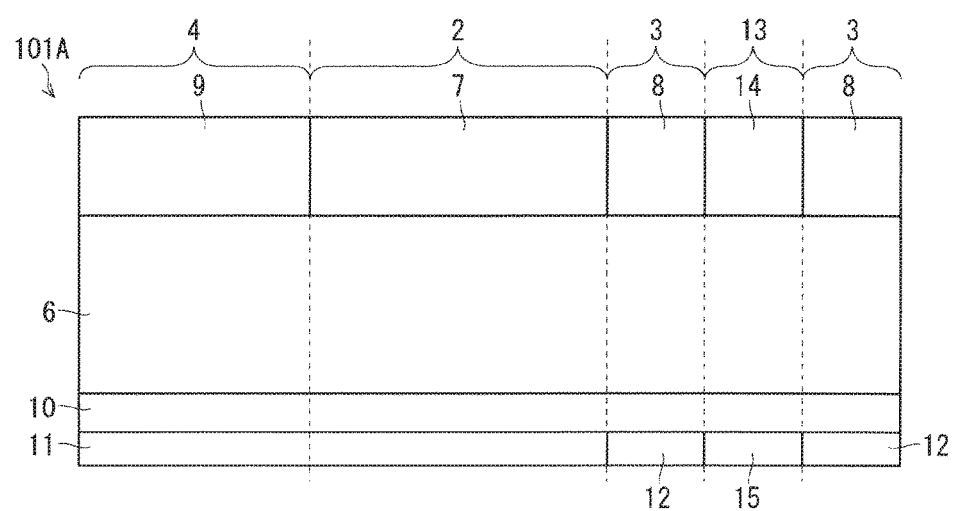
FIG. 8 is a schematic sectional view taken along B-B' of FIG. 7.

FIG. 8 is a schematic sectional view taken along B-B' of FIG. 7. As shown in FIG. 8, in the RC-IGBT 101A, on a first main surface side of an n– type drift layer 6, a high electric field cell 14 is arranged in the high electric field cell region 13. Specifically, the high electric field cell 14 is arranged in a region surrounded by a diode cell 8. Additionally, in the same layer as an n+ type cathode layer 12 and immediately under the high electric field cell 14, an n+ type diffusion layer 15 is formed. The n+ type cathode layer 12 and the n+ type diffusion layer 15 may be formed simultaneously. The high electric field cell 14, and the n– type drift layer 6, an n type buffer layer 10 and the n+ type diffusion layer 15 which are immediately thereunder configure the high electric field cell region 13. Other part of the configuration of the RC-IGBT 101A than these is the same as that of the RC-IGBT 1. The high electric field cell 14 is a region designed to have a higher electric field intensity when a voltage is applied between main terminals in the RC-IGBT 101A than those of the IGBT region 2, the diode region 3 and the withstand voltage holding region 4. A voltage between main terminals represents, in the IGBT region 2, a voltage between an emitter layer not shown of an IGBT cell 7 and a p+ type collector layer 11, in the diode region 3, represents a voltage between an anode layer not shown of the diode cell 8 and the n+ type cathode layer 12, and in the high electric field cell region 13, represents a voltage between an anode layer not shown of the high electric field cell 14 and the n+ type diffusion layer 15. An n type impurity concentration of the n– type drift layer 6 is set to be, for example, $1.0 \times 10^{13}/cm^3$ to $1.0 \times 10^{15}/cm^3$. Additionally, a surface concentration of p type impurities in the p+ type collector layer 11 is set to be, for example, $1.0 \times 10^{15}/cm^3$ or more. Additionally, a surface concentration of n type impurities in the n+ type cathode layer 12 and the n+ type diffusion layer 15 is set to be, for example, $1.0 \times 10^{17}/cm^3$ or more.

Figure 9:
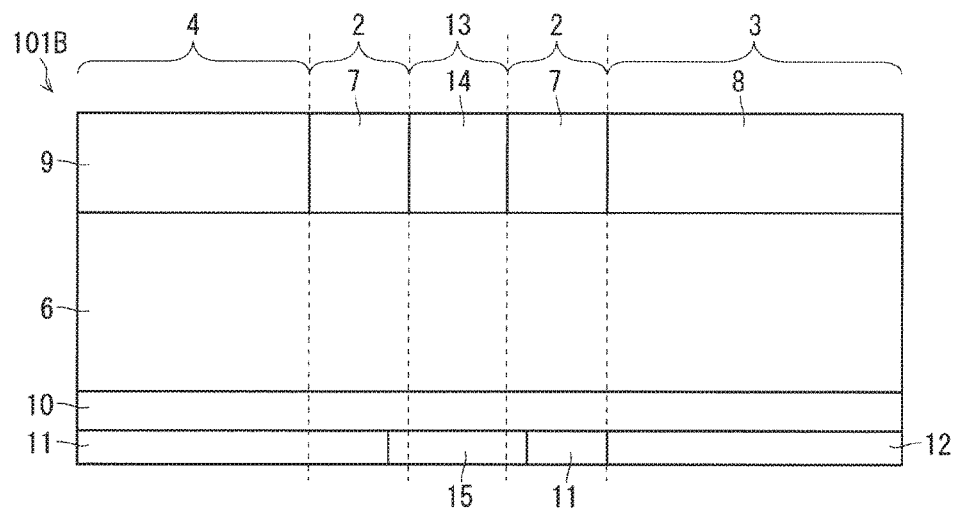
FIG. 9 is a schematic sectional view of an RC-IGBT according to a modification of the first preferred embodiment of the present invention.

The high electric field cell 14, which is arranged in a region surrounded by the diode cell 8 in the RC-IGBT 101A, may be arranged in a region surrounded by the IGBT cell 7. FIG. 9 is a schematic sectional view of a section, similarly to FIG. 8, of an RC-IGBT 101B according to a modification in which a high electric field cell 14 is arranged in a region surrounded by an IGBT cell 7. In the RC-IGBT 101B, the high electric field cell 14 is formed in a region on a first main surface of an n– type drift layer 6 and surrounded by the IGBT cell 7. Additionally, in a region on a second main surface of the n– type drift layer 6 and opposed to the high electric field cell 14, an n+ type diffusion layer 15 is formed with an n type buffer layer 10 provided therebetween. A maximum peak concentration of n type impurities in the n type buffer layer 10 is set to be, for example, $1.0 \times 10^{16}/cm^3$ to $1.0 \times 10^{17}/cm^3$.

As shown in FIGS. 8 and 9, in the RC-IGBTs 101A and 101B, the p+ type collector layer 11 and the high electric field cell 14 are arranged so as not to overlap in a direction vertical to the first main surface of the n– type drift layer 6 in a plane view. Then, a distance between the p+ type collector layer 11 and the high electric field cell 14 in a direction parallel to the first main surface of the n– type drift layer 6 is determined in view of preventing a flow of an avalanche current generated in the high electric field cell 14 into the p+ type collector layer 11.

B-2. Function and Effect

In the RC-IGBTs 101A and 101B, the high electric field cell 14 intentionally designed to have an electric field intensity higher than the IGBT cell 7, the diode cell 8 and the withstand voltage holding structure 9, is arranged on the first main surface side of a region where an n type diffusion layer (the n+ type diffusion layer 15) is arranged on the second main surface side of the n− type drift layer 6. This enables an avalanche current to be induced to the high electric field cell 14, the avalanche current being generated when a collector-emitter voltage exceeding an element withstand voltage is applied. Specifically, an avalanche current is to be generated in a region having the p-i-n structure with a high resistance to avalanche breakdown, resulting in increasing an avalanche breakdown resistance.

An avalanche current generated in the high electric field cell 14 flows in the direction vertical to the first main surface of the n− type drift layer 6, i.e. in an up-down direction on a sheet of each of FIGS. 8 and 9, and also simultaneously diffuses in a direction parallel to the first main surface, i.e. in a right-left direction on each sheet of FIGS. 8 and 9. For making an avalanche current stay in the p-i-n structure to obtain the effect of the present invention, it is necessary to ensure some distance between the p+ type collector layer 11 and the high electric field cell 14 in a direction parallel to the first main surface of the n− type drift layer 6, thereby preventing an avalanche current spreading in the direction parallel to the first main surface of the n− type drift layer 6 from flowing into the p+ type collector layer 11.

Figure 10:
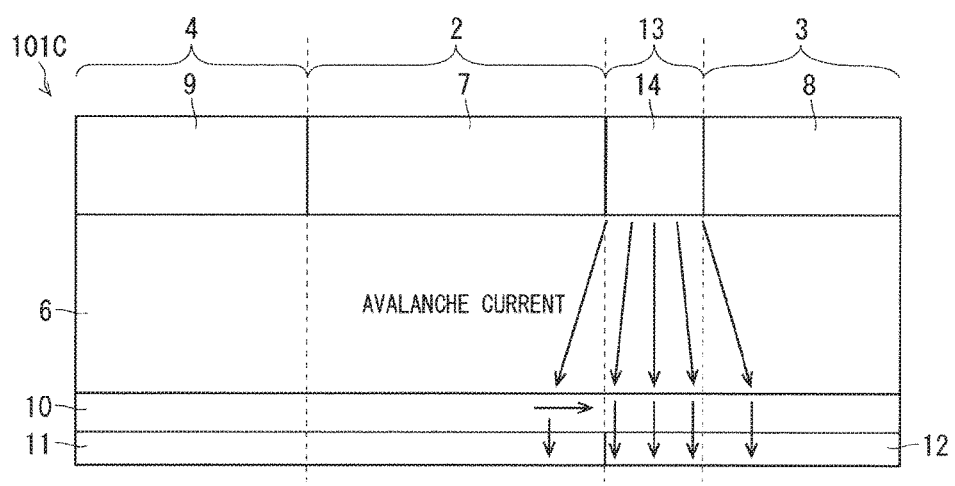
FIG. 10 is a schematic sectional view of an RC-IGBT according to a comparative example of the first preferred embodiment of the present invention.

FIG. 10 is a schematic sectional view of an RC-IGBT 101C of a comparative example in which the above distance is not ensured between a p+ type collector layer 11 and a high electric field cell 14 in a direction parallel to a first main surface of an n− type drift layer 6. In the RC-IGBT 101C, an avalanche current generated in the high electric field cell 14 spreads in the direction parallel to the first main surface of the n− type drift layer 6 and flows into an n type buffer layer 10 on the p+ type collector layer 11. At this time, when a voltage drop generated when an avalanche current flows in the n type buffer layer 10 exceeds a built-in potential of a pn junction formed between the p+ type collector layer 11 and the n type buffer layer 10, an avalanche current flows into the p+ type collector layer 11 to cause the p-n-p structure to operate, so that no effects of the present invention can be obtained. Therefore, in order to obtain the effects of the present invention, it is necessary to ensure some distance between the p+ type collector layer 11 and the high electric field cell 14 in the direction parallel to the first main surface of the n− type drift layer 6, thereby preventing an avalanche current from flowing into the p+ type collector layer 11.

FIG. 11 is a schematic sectional view of a simulation model 101D for verifying a phenomenon of flowing of an avalanche current into a p+ type collector layer 11. For the sake of simplicity, in the simulation model 101D, a p type diffusion layer 16 is formed on the entire surface, excluding a part thereof, of a first main surface of an n− type drift layer 6, and a region on the first main surface side of the n− type drift layer 6 is set to be a high electric field cell, in which region the p type diffusion layer 16 is not formed. Additionally, on a second main surface of the n− type drift layer 6, the p+ type collector layer 11 and an n+ type cathode layer 12 are formed via an n type buffer layer 10. An end portion P of the p type diffusion layer 16 has the highest electric field from which an avalanche current is generated.

FIG. 12 shows a simulation result of a current value obtained, in the simulation model 101D in FIG. 11, when a voltage is applied between a collector and an emitter, with a distance Wa varied, the Wa being a distance, in the direction parallel to the first main surface of the n− type drift layer 6, between a boundary between the p+ type collector layer 11 and the n+ type cathode layer 12 and the end portion P of the p type diffusion layer 16. As one example, this simulation is conducted with a distance of 130 μm from the first main surface of the n− type drift layer 6 to the second main surface and an n type impurity concentration of $8.1 \times 10^{13}/cm^3$ of the n− type drift layer 6 at a temperature of 298K.

In FIG. 12, a sign of the distance Wa is denoted as plus when the end portion P of the p type diffusion layer 16 is on the n type cathode layer 12, and denoted as minus when the same is on the p+ type collector layer 11. It can be found from FIG. 12 that a negative resistance region where a withstand voltage is decreased in a region with a large current is formed. This is because an avalanche current flows into the p+ type collector layer 11, so that holes are injected from the p+ type collector layer 11. Additionally, it can be found that changing Wa to the plus side increases currents switching to a negative resistance region. The more the currents switch to a negative resistance region, the harder shifting to the negative resistance region becomes, so that a resistance to breakdown is increased.

Figure 13:
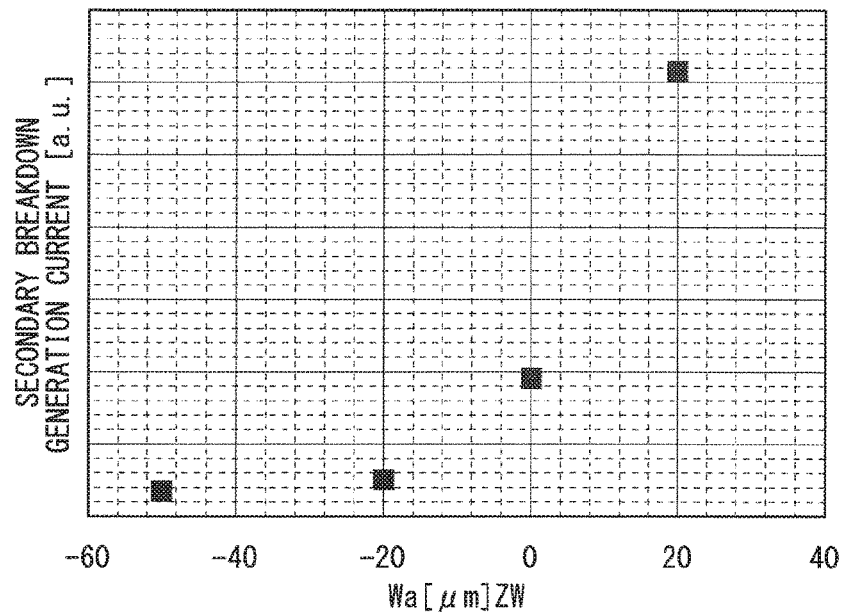
FIG. 13 is a diagram showing a relation between a current switched to a negative resistance region and a distance Wa.

FIG. 13 shows a relation between a current switched to a negative resistance region and the distance Wa. As shown in FIG. 13, a current switched to a negative resistance region is increased as the Wa is increased to the plus side and in particular, the increase in the current is large on the plus side with respect to 0 μm. Additionally, in this simulation model, with Wa≥20 μm, no flowing of an avalanche current into the p+ type collector layer 11 is sensed. Since a relation between the Wa and a current switched to a negative resistance region is affected by a thickness of the n− type drift layer 6, a depth and a concentration of the n type buffer layer 10, temperature and the like, a desirable relation is Wa≥20 μm, which is one example only.

B-3. Effects

As described in the foregoing, the RC-IGBTs 101A and 101B according to the first preferred embodiment of the present invention include the n− type drift layer 6 as a first conductive type drift layer; the IGBT cell 7, the diode cell 8 and the withstand voltage holding structure 9 which are formed on the first main surface of the n− type drift layer 6; the high electric field cell 14 formed in a region surrounded by the IGBT cell 7 or a region surrounded by the diode cell 8 on the first main surface of the n− type drift layer 6; the p+ type collector layer 11 as a second conductive type collector layer formed at a position opposed to the IGBT cell 7 and the withstand voltage holding structure 9, the position being on the second main surface opposite to the first main surface of the n− type drift layer 6; the n+ type cathode layer 12 as a first conductive type cathode layer formed at a position opposed to the diode cell 8 on the second main surface of the n− type drift layer 6; and the n+ type diffusion layer 15 as a first conductive type diffusion layer formed at a position opposed to the high electric field cell 14, the position being on the second main surface of the n− type drift layer 6. Then, the high electric field cell 14 has a higher maximum electric field intensity generated when an emitter-collector voltage as a voltage between main terminals is applied than those of the IGBT cell 7, the diode cell 8 and the withstand voltage holding structure 9. Additionally, the p+ type collector layer 11 and the high electric field cell 14 fail to overlap with each other in a plane view. Accordingly, the object of the present invention can be realized, which is to improve element performance by thinning the n− type drift layer 6, while ensuring a resistance to avalanche breakdown. While arranging the high electric field cell 14 and thinning the n− type drift layer 6 has a shortcoming of reducing an element withstand voltage as a whole, an increased avalanche breakdown resistance enables the n− type drift layer 6 to be designed to have a higher resistivity, which compensates for a reduction in an element withstand voltage.

In particular, by making a distance between the p+ type collector layer 11 and the high electric field cell 14 in the direction parallel to the first main surface of the n− type drift layer 6 larger than a distance in which an avalanche current generated in the high electric field cell 14 diffuses in the n− type drift layer 6 in the direction parallel to the first main surface of the n− type drift layer 6, an avalanche current generated in the high electric field cell 14 is prevented from flowing into the p+ type collector layer 11. Accordingly, an avalanche breakdown resistance is increased.

C. Second Preferred Embodiment

C-1. Configuration

A top view of a chip of an RC-IGBT 102 according to a second preferred embodiment is the same as the top view of the chip of the RC-IGBT 101A according to the first preferred embodiment shown in FIG. 7.

The RC-IGBT 102 according to the second preferred embodiment includes, in the RC-IGBT 101A according to the first preferred embodiment, trench structures which are simultaneously formed in an IGBT cell 7, a diode cell 8, and a high electric field cell 14 to lead to an n− type drift layer 6.

Figure 14:
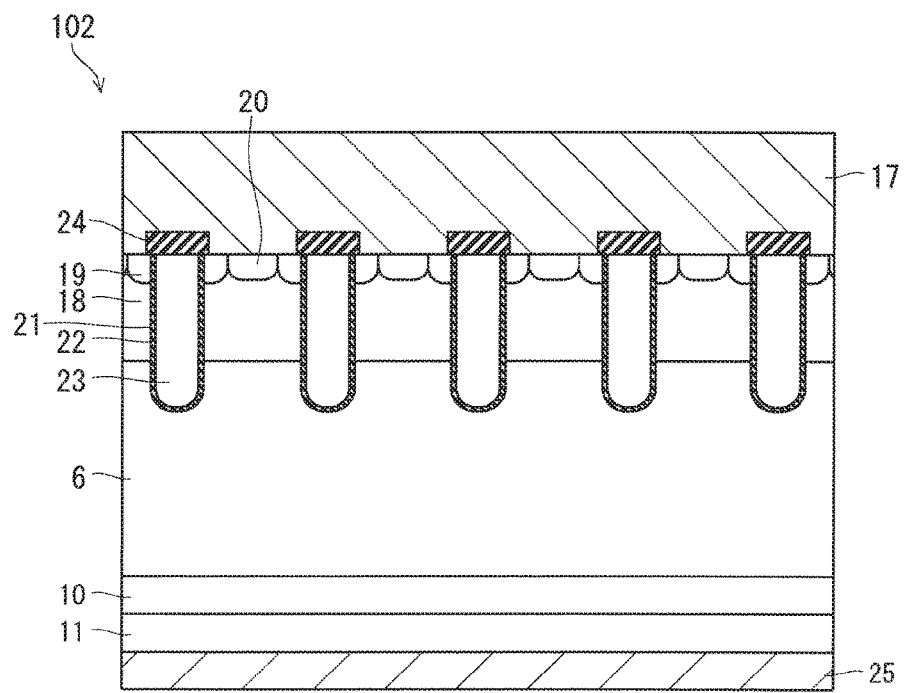
FIG. 14 is a schematic sectional view of an IGBT region of an RC-IGBT according to a second preferred embodiment of the present invention.

FIG. 14 is a schematic sectional view of an IGBT region 2 of the RC-IGBT 102, FIG. 15 is a schematic sectional view of a diode region 3 of the RC-IGBT 102, and FIG. 16 is a schematic sectional view of a high electric field cell region 13 of the RC-IGBT 102.

As shown in FIG. 14, in the IGBT region 2 of the RC-IGBT 102, a p type base layer 18 is formed on a first main surface of the n− type drift layer 6. On a top face of the p type base layer 18, an n+ type emitter layer 19 and a p+ type contact layer 20 are formed, and a trench 21 is formed which extends through the n+ type emitter layer 19 and the p type base layer 18 to lead to the n− type drift layer 6. On a surface of the trench 21, a gate oxide film 22 is formed, and within the trench 21, a gate electrode 23 is formed. On the gate electrode 23, an interlayer insulation film 24 is formed, and on the n+ type emitter layer 19, the p+ type contact layer 20 and the interlayer insulation film 24, an emitter electrode 17 is formed. Additionally, on a back surface side of a p+ type collector layer 11, a collector electrode 25 is formed. A peak concentration of p type impurities of the p type base layer 18 is set to be, for example, $1.0 \times 10^{17}/cm^3$ to $1.0 \times 10^{18}/cm^3$. Additionally, a surface concentration of n type impurities of the n+ type emitter layer 19 is set to be, for example, $1.0 \times 10^{18}/cm^3$ or more. Additionally, a surface concentration of p type impurities of the p+ type contact layer 20 is set to be, for example, $1.0 \times 10^{18}/cm^3$ or more.

As compared with the IGBT region 2 shown in FIG. 14, the diode region 3 of the RC-IGBT 102 shown in FIG. 15 has neither the n+ type emitter layer 19 nor the p+ type contact layer 20 formed, has an anode electrode 28 formed in place of the emitter electrode 17, has a p type anode layer 26 formed in place of the p type base layer 18, and has a cathode electrode 27 formed in place of the collector electrode 25. The remaining part of the configuration of the diode region 3 is the same as that of the IGBT region 2. However, a p+ type contact layer might be formed also in the diode region 3 in some cases. In such a case, p+ type contact layers in the IGBT region 2 and the diode region 3 may be formed simultaneously or formed individually. A peak concentration of p type impurities of the p type anode layer 26 is set to be, for example, $1.0 \times 10^{17}/cm^3$ to $1.0 \times 10^{18}cm/^3$.

Although the configuration of the high electric field cell region 13 of the RC-IGBT 102 shown in FIG. 16 is approximately the same as the configuration of the diode region 3 shown in FIG. 15, an n+ type diffusion layer 15 is provided in place of an n+ cathode layer 12, and one of the trenches 21 is formed to be deeper than the trenches 21 in the IGBT region 2 and the diode region 3. Although one trench 21 is formed deeper in FIG. 16, as one example, a plurality of trenches 21 may be formed deeper. Additionally, in the diode region 3 and the high electric field cell region 13, the gate electrode 23 may be connected to the emitter electrode 17, and for the connection with the emitter electrode 17, the interlayer insulation film 24 on the trench 21 may be omitted.

The emitter electrode 17 in the IGBT region 2 and the anode electrodes 28 in the diode region 3 and in the high electric field cell region 13 may be formed simultaneously or individually. Additionally, the collector electrode 25 in the IGBT region 2 and the cathode electrodes 27 in the diode region 3 and high electric field cell region 13 may be formed simultaneously or individually. Additionally, the p type base layer 18 in the IGBT region 2 and the p type anode layer 26 in the diode region 3 may be formed simultaneously or individually.

C-2. Function and Effect

It is a known technique to form a trench structure in the IGBT region 2 to improve IGBT element loss performance, and it is also a known technique to simultaneously form the trench structure also in the diode region 3. In the present invention, making a part of or all the trenches formed in the high electric field cell region 13 deeper than the trenches in the IGBT region 2 and the diode region 3 enables the high electric field cell region 13 to be designed to have a higher electric field intensity than those of the IGBT region 2 and the diode region 3. Accordingly, improvement in element performance attained by thinning the n− type drift layer 6 and ensuring of a resistance to avalanche breakdown can be realized without increasing costs.

Figure 17:
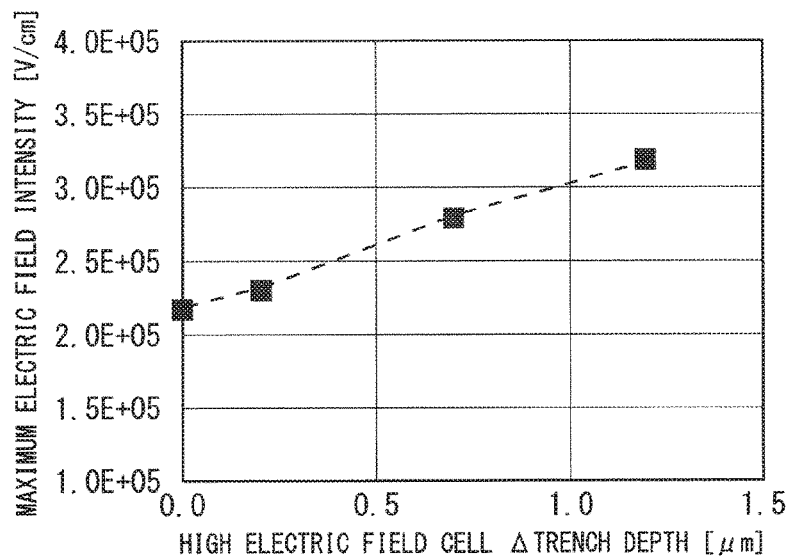
FIG. 17 is a diagram showing a simulation result of a maximum electric field intensity in Si when a depth of one trench in a high electric field cell is changed.

FIG. 17 shows a result of simulation of a maximum electric field intensity in Si when a depth of one trench 21 in the high electric field cell region 13 is changed as shown in FIG. 16. A size of the trench 21 as a reference in the present simulation is set to be 1.4 µm as a width and 5 to 6 µm as a depth, and a pitch of the trench 21 is set to be 2.4 µm. Additionally, a Δ trench depth indicated in FIG. 17 shows a difference in depth between one trench 21 with a depth varied and the reference trench 21. Additionally, a simulation model has a structure on the assumption of a rated voltage of 1200 V, in which a maximum electric field intensity is calculated when 1200 V is applied between a cathode and an anode (collector-emitter). As shown in FIG. 17, it can be found that as the depth of one trench 21 in the high electric field cell region 13 is increased, the maximum electric field intensity is increased.

A method of increasing a depth of only a part of the trenches 21 in the high electric field cell region 13 is, for example, adding a photoengraving processing step for a trench pattern and twice etching only the trench 21 to be deeper. However, with this method, the addition of the steps increases costs. Thus, as a method of changing a depth of only a part of the trenches 21 without adding a step, it is effective to change an opening width of only the trench 21 to be deeper. It is commonly known that an etching rate at the time of etching a trench varies with an opening width of the trench. Accordingly, the structure of the second preferred embodiment can be realized by changing an opening width of only the trench 21 to be deeper to a direction in which an etching rate is increased.

The emitter electrode 17, the anode electrode 28, the collector electrode 25, and the cathode electrode 27 in FIGS. 14, 15 and 16 are formed of metal such as Al, AlSi, Cu, Ti, Ni, Au. Additionally, although there is a case where on an interface between these electrodes and an Si substrate, a barrier metal is formed of Ti, TiSi, TiN, Co, CoSi, or the like for preventing diffusion to each other, no barrier metal is shown in FIGS. 14, 15, and 16.

As described in the foregoing, in the RC-IGBT 102 according to the second preferred embodiment, a plurality of the trenches 21 leading to the n– type drift layer 6 are formed in the IGBT cell 7, the diode cell 8 and the high electric field cell 14, and a depth of at least a part of the trenches 21 leading from the high electric field cell 14 to the n– type drift layer 6 is larger than that of the plurality of trenches 21 leading from the IGBT cell 7 and the diode cell 8 to the n– type drift layer 6. Accordingly, the high electric field cell region 13 can be designed to have a higher electric field intensity than those of the IGBT region 2 and the diode region 3. Thus, improvement in element performance attained by thinning the n– type drift layer 6 and ensuring of a resistance to avalanche breakdown can be realized without increasing costs.

D. Third Preferred Embodiment

D-1. Configuration

A top view of a chip of an RC-IGBT 103A according to a third preferred embodiment is the same as the top view of the chip of the RC-IGBT 101A according to the first preferred embodiment shown in FIG. 7.

The RC-IGBT 103A according to the third preferred embodiment is the same as the RC-IGBT 102 according to the second preferred embodiment in that an IGBT cell 7, a diode cell 8, and a high electric field cell 14 are provided with trench structures simultaneously formed to lead to an n– type drift layer 6. However, in the RC-IGBT 103A, by setting a pitch of a trench 21 leading from the high electric field cell 14 to the n– type drift layer 6 to be larger than a pitch of the trenches 21 leading from the IGBT cell 7 and the diode cell 8 to the n– type drift layer 6, a high electric field cell region 13 is designed to have a higher electric field intensity than those of an IGBT region 2 and a diode region 3.

A schematic sectional view of the IGBT region 2 in the RC-IGBT 103A is the same as the schematic sectional view of the IGBT region 2 in the RC-IGBT 102 according to the second preferred embodiment shown in FIG. 14. Additionally, a schematic sectional view of the diode region 3 in the RC-IGBT 103A is the same as the schematic sectional view of the IGBT region 2 in the RC-IGBT 102 according to the second preferred embodiment as shown in FIG. 15.

Figure 18:
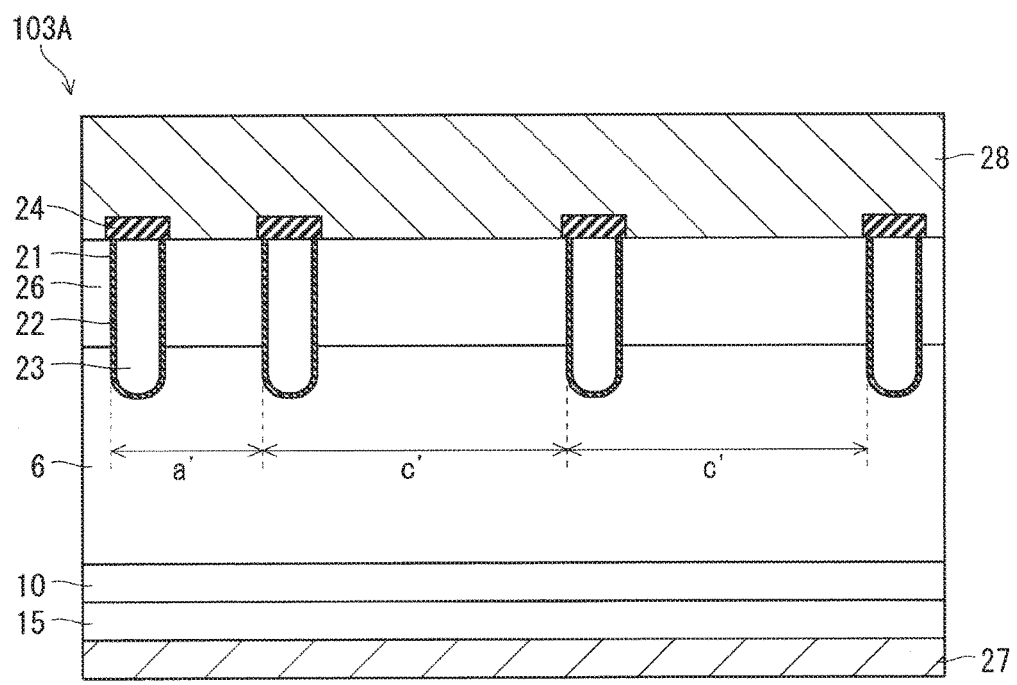
FIG. 18 is a schematic sectional view of a high electric field cell of an RC-IGBT according to a third preferred embodiment of the present invention.

FIG. 18 is a schematic sectional view of the high electric field cell region 13 in the RC-IGBT 103A. Among four trenches 21 shown in FIG. 18, a pitch c' between the right three trenches 21 is larger than a pitch a' between the trench 21 on the left end and the trench 21 on the right side thereof. The trenches 21 in the IGBT region 2 and the diode region 3 also have the pitch a'.

By setting at least one trench pitch in the high electric field cell region 13 to be larger than trench pitches in the IGBT region 2 and the diode region 3, the high electric field cell region 13 can be designed to have a higher electric field intensity than those of the IGBT region 2 and the diode region 3. Accordingly, although FIG. 18 shows an example where two trench pitches are larger, one or all trench pitches in the high electric field cell region 13 may be set to be larger than the trench pitches in the IGBT region 2 and the diode region 3, for example.

Figure 19:
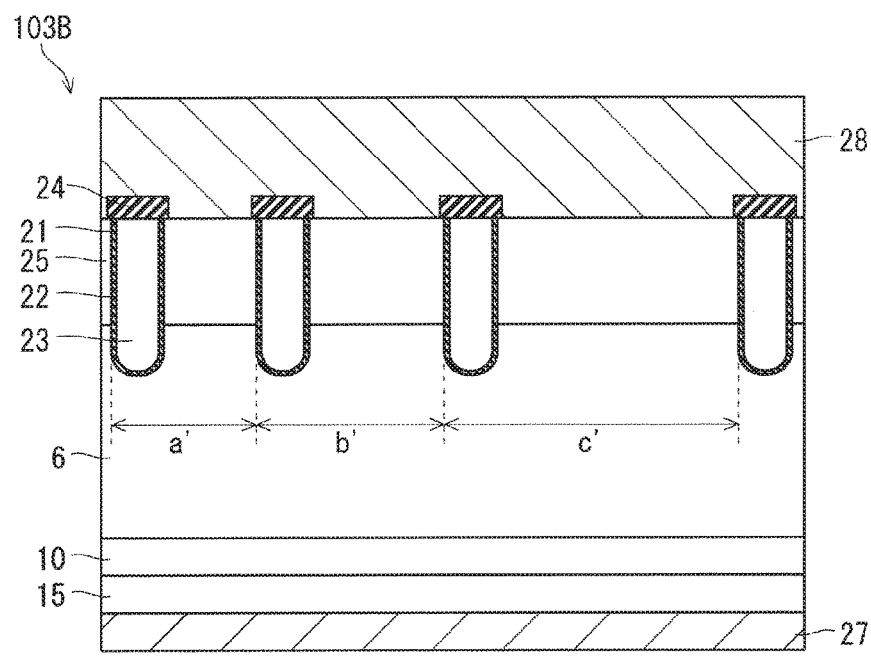
FIG. 19 is a schematic sectional view of a high electric field cell region of an RC-IGBT according to a modification of the third preferred embodiment of the present invention.

Additionally, as in an RC-IGBT 103B according to a modification, a trench pitch may be increased in stages in a high electric field cell region 13. FIG. 19 is a schematic sectional view of the high electric field cell region 13 in the RC-IGBT 103B. FIG. 19 shows four trenches 21 in the high electric field cell region 13, and three pitches among these four trenches 21 sequentially increase in the order of a', b', and c' from left.

Additionally, although in each of the RC-IGBTs 103A and 103B shown in FIG. 18 and FIG. 19, the trenches 21 have an equal depth in the high electric field cell region 13, the trenches 21 may have a larger depth by applying the features of the second preferred embodiment. For example, in the high electric field cell region 13, in a region where the trenches 21 are designed to have a large pitch, the trenches 21 may have a large depth.

D-2. Function and Effect

By increasing a pitch of the trench 21 only in the high electric field cell region 13, the high electric field cell region 13 can be designed to have a higher electric field intensity than those of the IGBT region 2 and the diode region 3. Accordingly, improvement in element performance attained by thinning the n– type drift layer 6 in the RC-IGBT can be realized while ensuring a resistance to avalanche breakdown.

Figure 20:
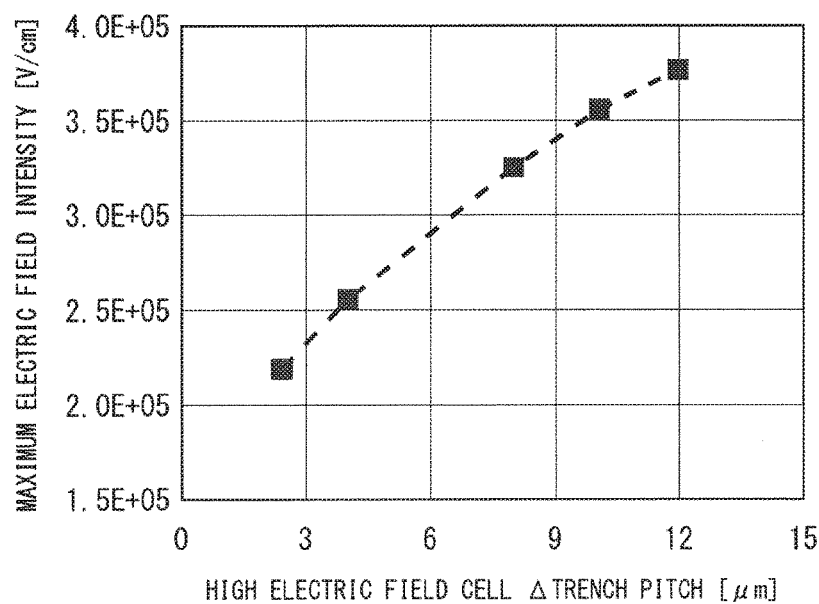
FIG. 20 is a diagram showing a relation between a trench pitch and a maximum electric field intensity.

FIG. 20 shows a simulation result of a maximum electric field intensity when the trench pitch c' is changed in the RC-IGBT 103A shown in FIG. 18. A basic structure and conditions for a maximum electric field intensity of the simulation are the same as those of the simulation in the second preferred embodiment. It can be found from the simulation result that an increase in the trench pitch c' increases the maximum electric field intensity.

In each of the RC-IGBTs 103A and 103B shown in FIG. 18 and FIG. 19, the trenches 21 have an equal depth in the high electric field cell region 13. In practice, however, in a part of a region with a large trench pitch, a trench opening rate is apt to be reduced to make the trench 21 deeper. When the trench 21 becomes deeper in a region with an increased trench pitch, the same effect as that of the second preferred embodiment can be obtained to enable designing to have a higher maximum electric field intensity.

As described in the foregoing, in the RC-IGBTs 103A and 103B according to the third preferred embodiment, a plurality of the trenches 21 leading to the n− type drift layer 6 is formed in the IGBT cell 7, the diode cell 8 and the high electric field cell 14, and at least a part of pitches of the trenches 21 leading from the high electric field cell 14 to the n− type drift layer 6 is larger than a pitch of the trench 21 leading from the IGBT cell 7 and the diode cell 8 to the n− type drift layer 6. Accordingly, the high electric field cell region 13 can designed to have a higher electric field intensity than those of the IGBT region 2 and the diode region 3. Thus, improvement in element performance attained by thinning the n− type drift layer 6 and ensuring of a resistance to avalanche breakdown can be realized without increasing costs.

E. Fourth Preferred Embodiment

E-1. Configuration

A top view of a chip of an RC-IGBT 104 according to a fourth preferred embodiment is the same as the top view of the chip of the RC-IGBT 101A according to the first preferred embodiment shown in FIG. 7. A sectional view of an IGBT region 2 in the RC-IGBT 104 is shown in FIG. 21, and a sectional view of a high electric field cell region 13 is shown in FIG. 22. As shown in FIG. 21, the RC-IGBT 104 includes an n type carrier storage layer 29 between a p type base layer 18 and an n− type drift layer 6 in the IGBT region 2. Additionally, as shown in FIG. 22, the RC-IGBT 104 includes the n type carrier storage layer 29 between a p type anode layer 26 and the n− type drift layer 6 in the high electric field cell region 13. Configuration of the other part than the carrier storage layer 29 of the RC-IGBT 104 is the same as that of the RC-IGBT 103A according to the third preferred embodiment.

A peak concentration of n type impurities of the carrier storage layer 29 is $1 \times 10^{15}/cm^3$ or more.

E-2. Function and Effect

A structure in which an n type carrier storage layer is formed in an IGBT region in order to improve IGBT element loss performance is proposed in Japanese Patent No. 3288218. In a case where the carrier storage layer 29 is provided, an electric field is apt to be increased more due to an increase in a trench pitch than otherwise. In the RC-IGBT 104, because of provision of the n type carrier storage layer 29 in the high electric field cell 14, when the pitch of the trench 21 is increased, the high electric field cell 14 is apt to have a higher electric field. Accordingly, this facilitates ensuring an electric field difference between the high electric field cell region 13, and the IGBT region 2 and the diode region 3.

Figure 23:
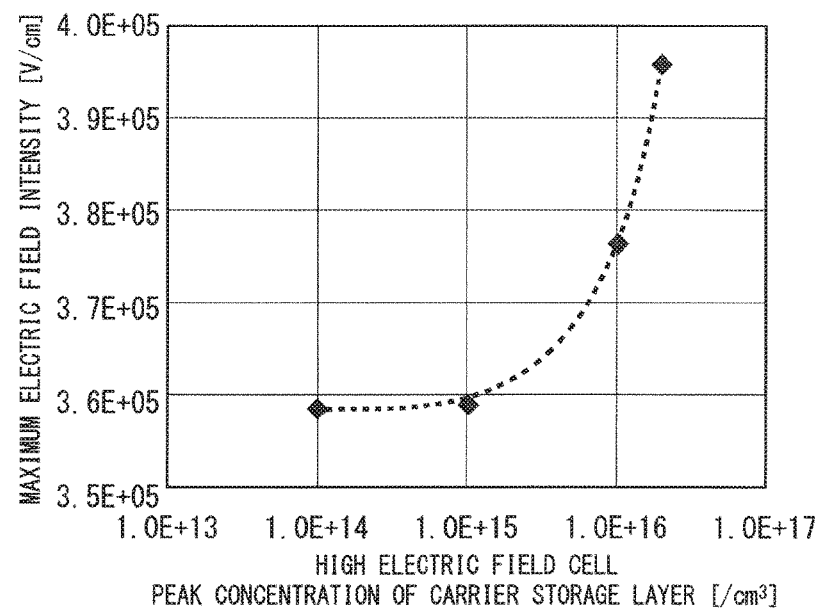
FIG. 23 is a diagram showing a dependency of a maximum electric field intensity on a peak concentration of a carrier storage layer.

Here, a simulation result is shown in FIG. 23, which simulation is made of dependency of a maximum electric field intensity on a peak concentration of the n type impurities in the carrier storage layer 29, with the trench pitch of the high electric field cell region 13 set to be 10 μm in the RC-IGBT 104 shown in FIG. 22. A basic structure and conditions for a maximum electric field intensity of the simulation are the same as those of the contents recited in the second preferred embodiment. It can be found from FIG. 23 that setting the peak concentration of the carrier storage layer 29 to be $1.0 \times 10^{15}/cm^3$ or more, the effect of increasing the maximum electric field intensity can be obtained more effectively.

As described in the foregoing, the RC-IGBT 104 according to the fourth preferred embodiment of the present invention includes the carrier storage layer 29 of n type as a first conductive type in the IGBT cell 7 and the high electric field cell 14, and has a peak concentration of the n type impurities in the carrier storage layer 29 set to be $1 \times 10^{15}/cm^3$ or more. Accordingly, the high electric field cell region 13 is allowed to have a higher electric field intensity than those of the IGBT region 2 and a diode region 3.

F. Fifth Preferred Embodiment

F-1. Configuration

A top view of a chip of an RC-IGBT 105 according to a fifth preferred embodiment is the same as the top view of the chip of the RC-IGBT 101A according to the first preferred embodiment shown in FIG. 7.

Figure 24:
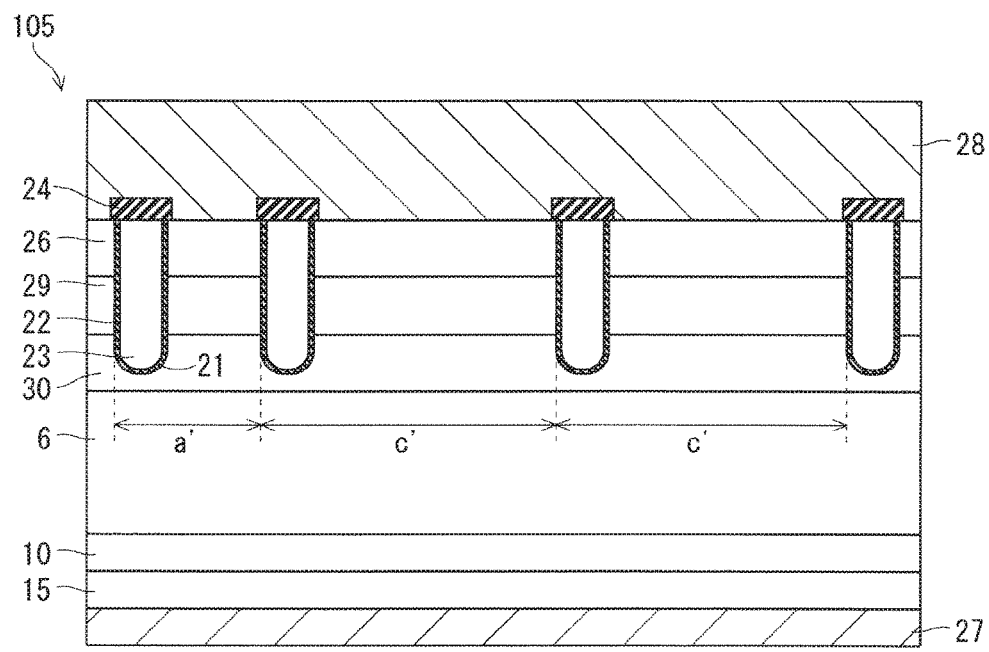
FIG. 24 is a schematic sectional view of a high electric field cell region of an RC-IGBT according to a fifth preferred embodiment of the present invention.

FIG. 24 is a schematic sectional view of a high electric field cell region 13 in the RC-IGBT 105. The RC-IGBT 105 includes an n type layer 30 between an n− type drift layer 6 and a carrier storage layer 29 in a diode region 3 and the high electric field cell region 13. This n type layer 30 is formed by irradiation with proton from above a diode cell 8 and a high electric field cell 14. The remaining part of the configuration of the RC-IGBT 105 other than the n type layer 30 is the same as that of the RC-IGBT 104 according to the fourth preferred embodiment.

The description is here made of the RC-IGBT 105 according to the fifth preferred embodiment configured with the n type layer 30 added to the RC-IGBT 104 according to the fourth preferred embodiment, the layer being formed by irradiation with proton. In addition, the n type layer 30 formed by irradiation with proton is also applicable to the second preferred embodiment or to the third preferred embodiment.

F-2. Function and Effect

Irradiation of the diode region 3 with proton enables life time of silicon to be locally controlled to improve loss performance as a diode element. Additionally, irradiation with proton leads to simultaneous formation of the n type layer 30. Accordingly, irradiation of the diode region 3 and the high electric field cell 14 with proton enables local control of life time to improve loss performance of a diode element, while the simultaneously formed n type layer 30 facilitates designing of the high electric field cell 14 to have a high electric field intensity, thereby facilitating ensuring of an electric field difference from other regions.

G. Modification

While the above preferred embodiments have been described with respect to examples of application of the present invention to an RC-IGBT, the present invention is also applicable to a diode having no IGBT region.

Additionally, while the above preferred embodiments have been described with respect to examples of application of the present invention to a power semiconductor device as a silicon device, the present invention is also applicable to a power semiconductor device of a silicon carbide device.

The present invention allows the respective exemplary embodiments to be freely combined or appropriately modified or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A method for manufacturing a power semiconductor device
the power semiconductor device comprising
a first conductive type drift layer,
an IGBT cell, a diode cell, and a withstand voltage holding structure which are formed on a first main surface of said drift layer,
a high electric field cell formed in a region surrounded by said IGBT cell or in a region surrounded by said diode cell on said first main surface of said drift layer,
a second conductive type collector layer formed at a position opposed to said IGBT cell and said withstand voltage holding structure, the position being on a second main surface opposite to said first main surface of said drift layer,
a first conductive type cathode layer formed at a position opposed to said diode cell on said second main surface of said drift layer, and
a first conductive type diffusion layer formed at a position opposed to said high electric field cell on said second main surface of said drift layer,
wherein said high electric field cell has a higher maximum electric field intensity generated when a voltage is applied between main terminals than maximum electric field intensities of said IGBT cell, said diode cell and said withstand voltage holding structure, and
wherein said collector layer and said high electric field cell fail to overlap with each other in a direction vertical to the first main surface of said drift layer in a plane view,
the method comprising the step of conducting proton irradiation from above said diode cell and said high electric field cell.

* * * * *